United States Patent

Karl et al.

Patent Number: 5,946,186
Date of Patent: Aug. 31, 1999

[54] LATCH APPARATUS AND ATTACHMENT SYSTEM

[75] Inventors: Rex A. Karl, Temple; James E. Altic, Belton; Carrie D. Bader, Georgetown, all of Tex.

[73] Assignee: Texas Instruments Incorporated, Dallas, Tex.

[21] Appl. No.: 08/987,407

[22] Filed: Dec. 9, 1997

Related U.S. Application Data

[62] Division of application No. 08/706,366, Aug. 30, 1996.

[51] Int. Cl.$^6$ ........................................... H05K 5/00
[52] U.S. Cl. ............................ 361/686; 403/181; 403/63
[58] Field of Search ................................. 403/181, 180, 403/54, 63, 72; 439/310; 361/686; 292/196, DIG. 5, 139, 158, 26, 36, 47, 48, 82, 123, 97, 167, 186, 223, 233

[56] References Cited

U.S. PATENT DOCUMENTS

| | | | |
|---|---|---|---|
| 5,212,628 | 5/1993 | Bradbury | 361/686 X |
| 5,292,267 | 3/1994 | Kobayashi et al. | 439/310 |
| 5,544,010 | 8/1996 | Schultz et al. | 361/686 |
| 5,555,491 | 9/1996 | Tao | 361/686 |
| 5,586,900 | 12/1996 | Yagi et al. | 439/310 |
| 5,633,782 | 5/1997 | Goodman et al. | 439/310 X |
| 5,777,480 | 7/1998 | Hatagishi et al. | 439/310 X |

*Primary Examiner*—Lynne A. Reichard
*Assistant Examiner*—John R. Cottingham
*Attorney, Agent, or Firm*—Ronald O. Neerings; Richard L. Donaldson

[57] ABSTRACT

A latch apparatus for a docking station includes a first member connected to a pivot connection on a base portion of the docking station and a second member connected to the first member. The second member is substantially curved so as to form a mechanical moment. A third member is connected to the second member and to a lever. the latch apparatus is operable to decrease an initial rest angle between the first member and the base portion of the docking station and thereby substantially reduce lateral friction forces which develop when the base portion of the docking station is moving laterally. The latch apparatus is further provides mechanical advantage via the mechanical moment which decreases the amount of force required to be applied to the lever to accomplish a given amount of work.

6 Claims, 4 Drawing Sheets

LATCH APPARATUS AND ATTACHMENT SYSTEM

This application is a division of application Ser. No. 08/706,366 filed on Aug. 30, 1996.

FIELD OF THE INVENTION

This invention is in the field of latching mechanisms and is more particularly related to a latch apparatus and attachment system in computer docking stations.

BACKGROUND OF THE INVENTION

FIG. 1 is a diagram illustrating a docking station 10. Docking station 10 houses actuating lever 14, electrical contacts 21, and base portion 21. End mounting guides 16 and center mounting guide 18 are disposed upon base portion 12 along its frontal edge. A portable computer, having mount openings along the rear edge of its bottom surface, is placed for docking upon base portion 12; enjoining the mount openings with mounting guides 16 and 18. FIG. 2 is a prior art diagram station 10 has latching apparatus 11 pivotally connected to both the base portion 12 and actuating lever 14 by pivot connections 13 and 19, respectively. As force is applied in a generally downward sense to lever 14, connection 19 causes apparatus 11 to laterally draw base portion 12 into docking station 10 via pivot 13, as indicated by motion line 5. As base portion 12 slides into docking station 10, a portable computer, disposed upon guides 16 and 18 of the base portion 12, is brought into electrical contact with docking station 10 by electrical contacts 21.

In prior art FIG. 2, apparatus 11 forms an initial rest angle $\theta$ with base portion 12 when lever 14 is in an "open" or "undocked" position. Initial rest angle $\theta$ is greater than 45 degrees. As a downward force (F) is exerted upon lever 14, a force (labelled "A") is exerted upon the pivot connection 13. As is well known, force A can be separated into "X" and "Y" component forces, $A_x$ and $A_y$. As is also well known, the vertical component force, $A_y$, exerts a downward force and plays no role in moving base portion 12 laterally. The lateral component force, $A_x$, exerts a lateral force as is shown in FIG. 2. In order for base portion 12 to move in the "X" direction, the lateral force $A_x$ must be greater than the opposing frictional force $F_{friction}$ as shown in FIG. 2. As is well known in physics, the frictional force $F_{friction}$ is $\mu N$, where $\mu$ is the coefficient of friction and N is the normal force N, which equals the vertical force $A_Y$ being exerted on pivot connection 13.

Because $\theta$ is greater than 45 degrees at its rest position, the force (F) on lever 14 has a large vertical component $A_Y$, thereby resulting in a large normal force N. This large normal force N undesirably increased the frictional force $F_{friction}$ and resulted in base portion 12 not easily moving laterally. As a user exerts greater force on lever 14 the vertical component force $A_Y$ increases, thereby exacerbating the problem. This binding problem of latching apparatus 11 results in poor performance when mating a portable computer to docking station 10.

Another problem with prior latching apparatus 11 is that upon mating a portable computer to docking station 10, no mechanical mechanism or detent exists to lock latching apparatus 11 in place, thereby ensuring that the portable computer and docking station 10 maintain their positional relationship until a user wishes to "unlock" the portable computer from docking station 10.

It is an object of this invention to provide a latching apparatus that eliminates the binding problem of prior art latching apparatus 11. It is another object of the invention to provide a latching apparatus and attachment system that effectively locks a portable computer and a docking station together, thereby maintaining a desirable physical relationship between the two until a user wishes to separate them.

Other objects and advantages of the invention will be apparent to those of ordinary skill in the art having reference to the following specification and drawings.

SUMMARY OF THE INVENTION

A latch apparatus and attachment system for a docking station, providing improved ease of closure and a connection lock capability, includes multiple connected latch apparatus members. The docking station houses a laterally moveable base portion, upon which a computer is placed for sliding movement to engage and disengage with the docking station. This base portion extends from and retracts towards the docking station responsive to force applied to an open/close lever of the docking station and transferred to the base portion through the latch apparatus. The bottom surface of this movable base portion directly contacts the work surface upon which the docking station rests. A first member of the latch apparatus is drivably connected at one end to the moveable base portion of the docking station. Another end of the first member is connected to one end of an arcuate second member of the latch apparatus. The second member is substantially curved to form a mechanical moment about its curvature as force is applied at either end of the member; and pivotally fixed at its apex. Another end of the second member is connected to one end of a third member. The third member is drivably connected at another end to an actuating lever, pivotally connected to the docking station and separate from the base portion. Force is applied by a user directly to the lever to move the computer, via the base portion, in relation to the docking station. The multiple member latch apparatus forms an optimal rest angle between the first member and the movable base portion of the docking station. As force is applied through the lever and latch members, this optimal rest angle results in reduced lateral friction forces on the base portion as the base portion of the docking station moves laterally. The curved member of the latch apparatus results in a smaller amount of force required to accomplish movement of the base portion and computer. As force is applied to the lever, moment created about the curved member improves efficiency of the transferal of force through the latch members. Additionally, the latch apparatus and attachment system provides a capability to restrict the movement of the latch members, securing the movable base portion and a positional relationship between the docking station and a portable computer.

DESCRIPTION OF THE INVENTION

Figure 1:
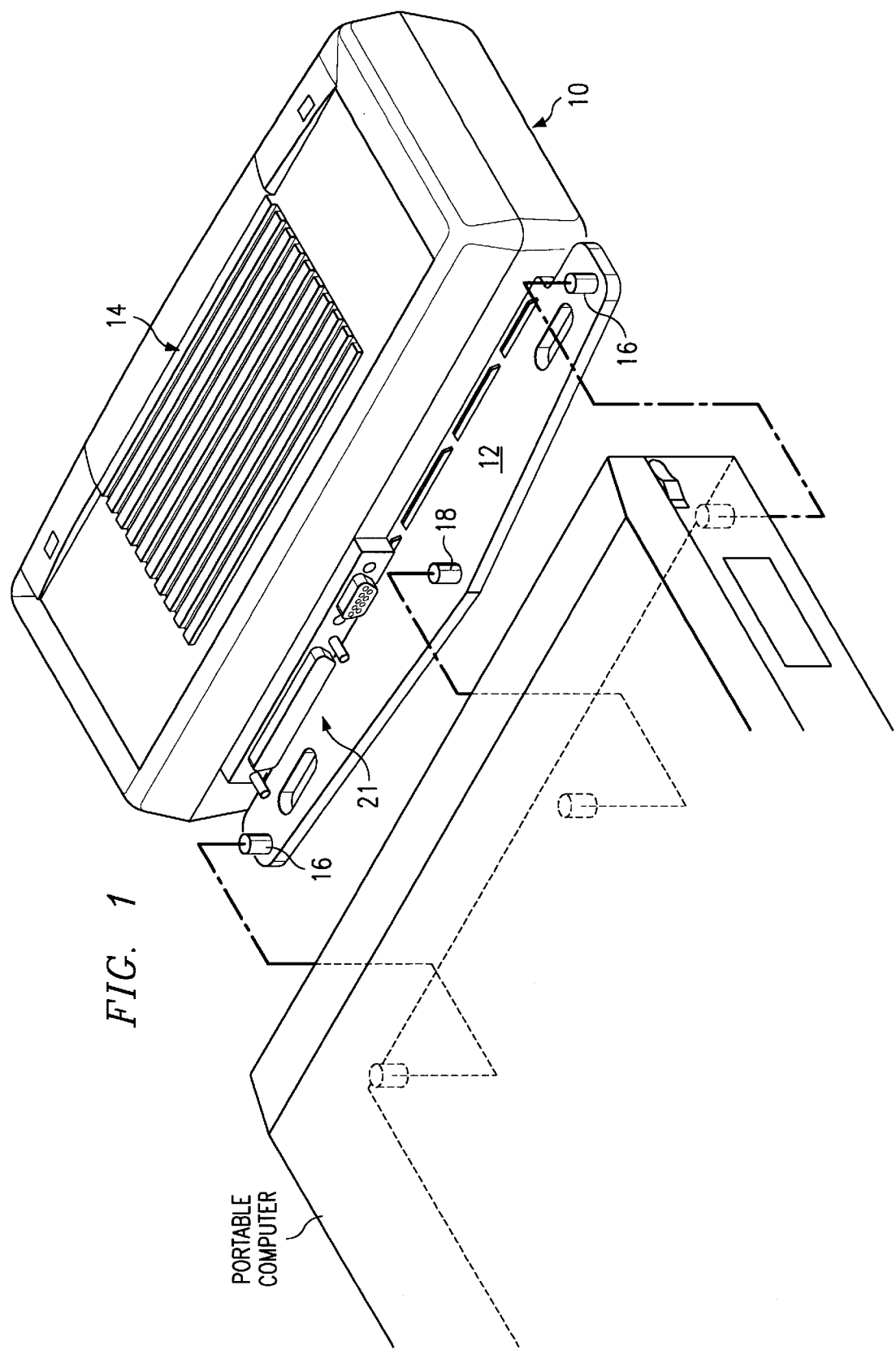
FIG. 1 is a diagram illustrating a portable docking station 10.
Figure 2:
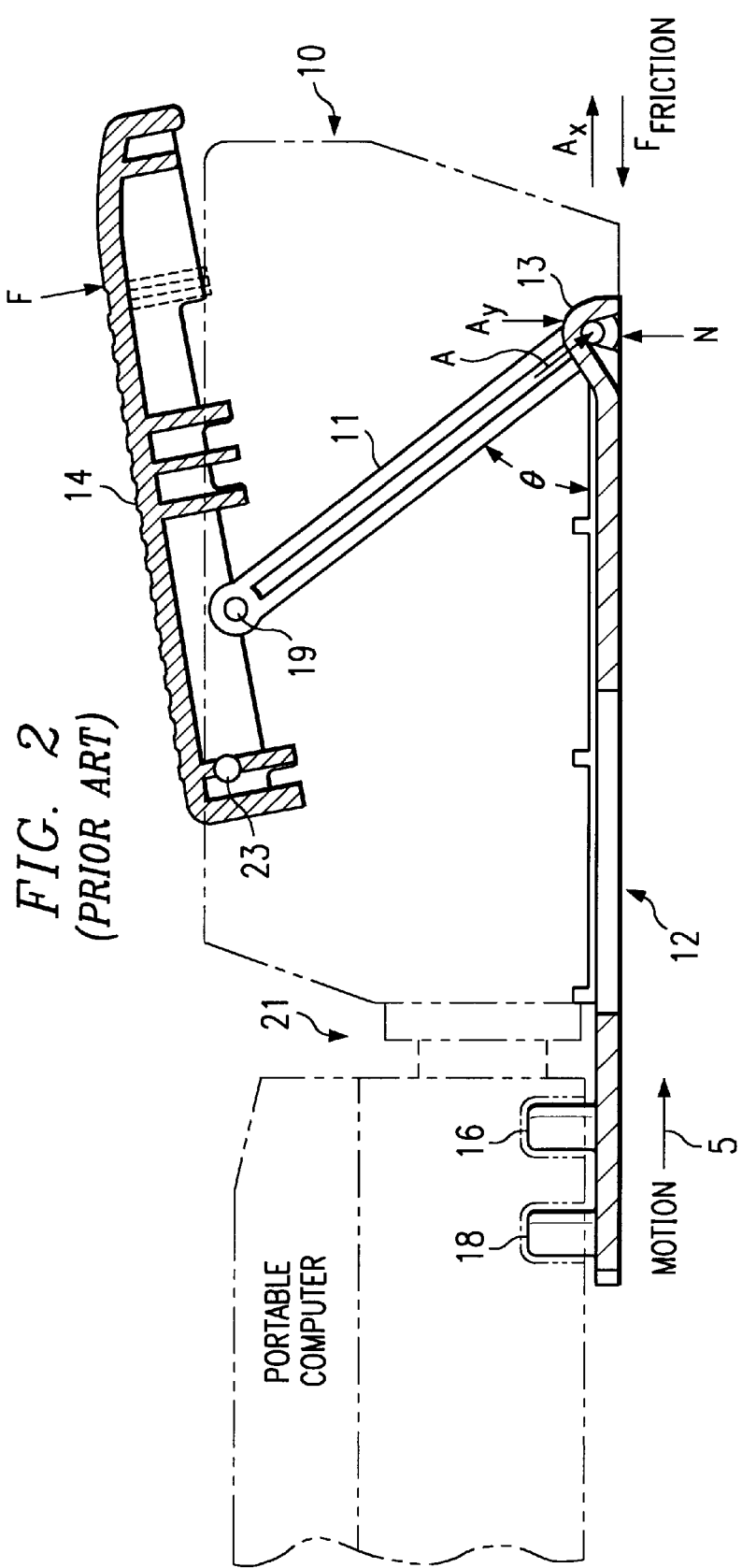
FIG. 2 is a prior art latching apparatus 11 utilized with docking station 10.
Figure 3:
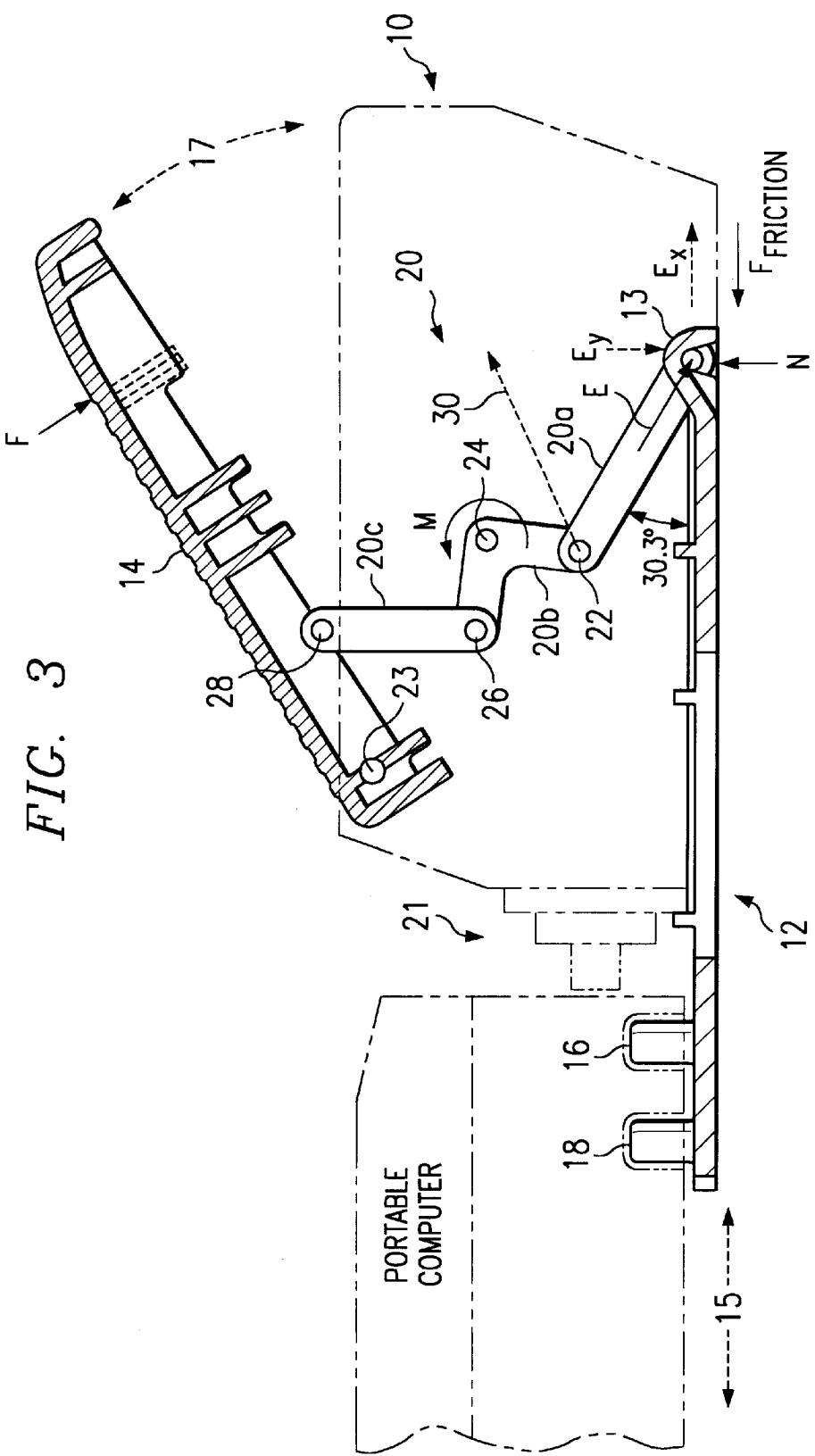
FIG. 3 is an embodiment of the invention, a latching apparatus 20 in a first position utilized with docking station 10.

FIG. 3 is a diagram illustrating an embodiment of the invention, a latch apparatus and attachment system including a latching apparatus 20 utilized in docking station 10. Lever 14 is depicted in an "open" position, being pivotally connected to docking station 10 by connection 23 and being capable of movement as indicated by line 17. As lever 14 is at an initial rest or open position, a portable computer disposed upon guides 16 and 18 is "undocked"; not mated with the electrical contacts 21 of docking station 10. Latch apparatus 20 has a first member 20a which connects at one end to base portion 12 by pivot connection 13. Connection 13 is both a translational and rotational connection. Member 20a connects at its other end to one end of second member 20b by connection 22. Connection 22 is both a translational and rotational connection. Member 20b is a substantially "L" shaped member and is pivotally fixed at rotation point 24 within docking station 10. Second member 20b connects at its other end to one end of third member 20c by connection 26. Connection 26 is both a translational and rotational connection. Third member 20c connects at its other end to lever 14 by connection 28. Connection 28 is both a translational and rotational connection. In the preferred embodiment, latch 20 is constrained, by construct and connection of the latch members, to planar movement, normal to the plane of movement for base portion 12. Latch apparatus 20 replaces prior art latch 11 in docking station 10 and provides improvement over the prior art by eliminating binding problems and enabling a locking capability to ensure a portable computer remains "locked" to docking station 10 when lever 14 is fully actuated.

As force (F) is applied to lever 14, third member 20c moves in a generally downward direction. As third member 20c thus moves, so does the connection 26, causing a counterclockwise rotation about point 24, creating a moment M. The rotation of second member 20b causes connection 22, as illustrated in FIG. 3, to move generally along line 30 as indicated, and transfers force (E) to first member 20a. Force (E) is transferred by first member 20a to connection 13 and drivably moves base portion 12 towards the rear of docking station 10. The transfer of force (E) to base portion 12 contributes to a frictional force ($F_{friction}$) and a lateral movement force ($E_x$) as later described. As force is applied in such a manner through the latch apparatus, such that the lateral force ($E_x$) exceeds the frictional force ($F_{friction}$), base portion 12 moves laterally and draws a portable computer attached thereto in connection with docking station 10.

Latch 20 substantially reduces the frictional force ($F_{friction}$) by reducing the initial rest angle to substantially less than 45 degrees. In this particular embodiment, the initial rest angle is effected to 30.3 degrees by construct of docking station 10. This angle may be selectively altered by changing component lengths, changing proximity of connections, and other modifications apparent to those skilled in the art. As force (F) is exerted upon lever 14, force (E) results upon connection 13. Force (E) can be broken into its horizontal and vertical component forces, $E_x$ and $E_y$ respectively. Because $E_x$ is equal to $E\cos(\theta)$, it is apparent that because $\theta$ is substantially smaller that a substantially greater force is exerted in the lateral direction. In the same manner, since $E_y$ is equal to $E\sin(\theta)$ that a substantially smaller vertical (downward) force is exerted upon pivot connection 13. Therefore the frictional force ($F_{friction}$) is substantially reduced because $N=E_y=E\sin(\theta)$ and $F_{friction}=\mu N=\mu E_y=\mu E\sin(\theta)$.

Latch 20 further reduces the amount of force F that needs to be exerted upon lever 14 by use of mechanical advantage. In FIG. 3, latch 20 is in a first position, more specifically at its initial rest position. When a force F is exerted upon lever 14, third member 20c exerts a generally downward force on second member 20b. The generally downward force on second member 20b creates a moment M about the "elbow" of second member 20b. As is well known in mechanics, a moment creates leverage or mechanical advantage, thereby reducing the amount of force needed to perform a given amount of work. Force F simultaneously creates movement between 20b and 20c, reducing the amount of force F needed to be exerted upon lever 14 to overcome frictional force $F_{friction}$ and initiate lateral movement for base portion 12.

Latch 20 provides another substantial advantage over prior art latch 11 by enabling a system locking feature which effectively locks a portable computer and docking station 10 together in their desired spatial relationship until a user wishes to unlock them. This automatic locking feature overcomes a serious and substantial drawback in prior art latch 11.

As force F is exerted upon lever 14 the "elbow" of second member 20b rotates in a counterclockwise fashion as illustrated in FIG. 3. At the same time connection 22 moves generally along line 30 as illustrated in FIG. 3. At a point along line 30, the effective length of the latch apparatus 20, between point 24 and pivot 13, exceeds the corresponding space provided by docking station 10. This point along line 30 may be called a "breakover point" where the latch moves over a high center of force. Beyond the "breakover point" forces begin operating in opposite directions as is well known by those skilled in the art. At the "breakover point" various components in docking station 10 are stressed and marginally flex to allow member 20b to rotate past the "breakover point." In this particular embodiment, only a few thousandths of an inch flex is needed to overcome the "breakover point." Obviously, an additional or supplemental force is required to sufficiently cause system components to flex enough to pass beyond the "breakover point." This supplemental force represents an effective locking force which must be overcome if one wishes to unlock a portable computer from docking station 10.

The magnitude of the supplemental force may be varied depending upon a user's application. The supplemental force may be increased by making the materials comprising latch 20 or pivot connection 13 or base portion 12 a harder or more rigid material. Alternatively, the length of members 20a, 20b, or 20c could be increased, thereby requiring the various components to flex a further distance. Other ways of increasing or decreasing the supplemental force to overcome the "breakover point" are contemplated by this invention.

Figure 4:
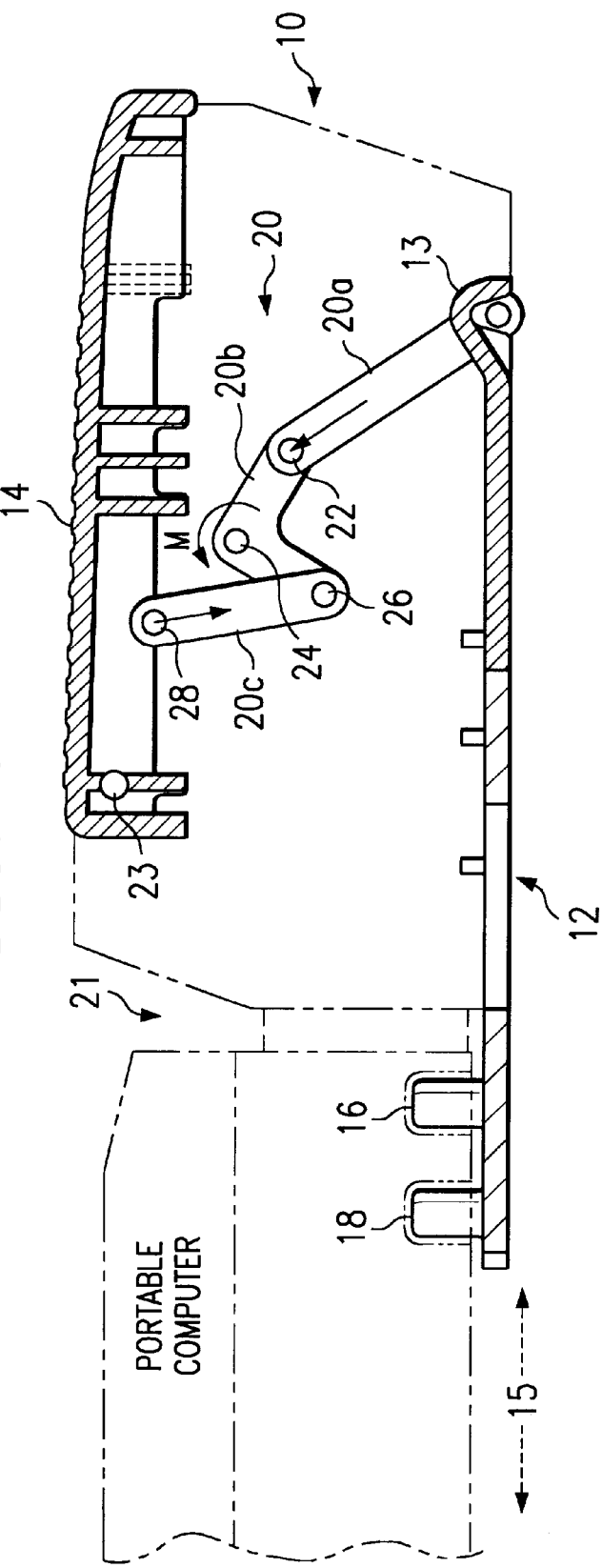
FIG. 4 is latching apparatus 20 in a second position utilized with docking station 10.

Upon passing the "breakover point" latch 20 is now in its second position as illustrated in FIG. 4. In this second position lever 14 is effectively "locked" into its position unless a user supplies sufficient supplemental force to move connection 22 past the "breakover point." Therefore, the "breakover point" of latch 20 results in an ability to restrict unintended movement of the latch members, thereby restricting unintended movement of base portion 12, and thereby effectively enables an attachment system lock functionality without a user to do any additional functions.

Although the invention has been described with reference to the preferred embodiment herein, this description is not to be construed in a limiting sense. Various modifications of the disclosed embodiment will become apparent to persons skilled in the art upon reference to the description of the invention. It is therefore contemplated that the appended claims will cover any such modifications or embodiments as fall within the true scope of the invention.

What is claimed is:

1. A method for providing a securable docking station attachment system, said method comprising:

providing a housing, having an electrical connector, adapted to engage with a portable computer also having an electrical connector;

providing a plate within said housing, proximally and distally slidable from the housing, adapted to engage with the portable computer;

providing an actuator pivotally connected to said housing, movable between positions for engaging and disengaging the portable computer with said docking station; and providing an apparatus drivably connecting said actuator to said plate, said apparatus including a first member pivotally connected to said plate, a second member pivotally connected to said actuator, and a third arcuate member pivotally connecting said first and second members.

2. A method of improving mechanical efficiency of a docking station attachment system, said method comprising:

providing a housing adapted to engage with a portable computer;

providing a plate within said housing, proximally and distally slidable from the housing, adapted to engage with and support the portable computer;

providing an actuator pivotally connected said housing, leverably movable between positions for engaging and disengaging the portable computer with said docking station; and providing a linkage drivably connecting said actuator to said plate, said linkage including a first member pivotally connected to said plate such that an angle between said first member and said base plate is less than 45 degrees, a second member pivotally connected to said actuator, and a third member pivotally connecting said first and second members.

3. The method of claim 1 further including the step of moving said actuator from said position for disengaging the portable computer to said position for engaging said portable computer to cause said electrical connection of said housing and said electrical connection of said portable computer to engage.

4. The method of claim 3 further including the step of moving said actuator from said position for engaging the portable computer to said position for disengaging said portable computer to cause said electrical connection of said housing and said electrical connection of said portable computer to disengage.

5. The method of claim 2 further including the step of moving said actuator from said position for disengaging the portable computer to said position for engaging said portable computer to cause said electrical connection of said housing and said electrical connection of said portable computer to engage.

6. The method of claim 5 further including the step of moving said actuator from said position for engaging the portable computer to said position for disengaging said portable computer to cause said electrical connection of said housing and said electrical connection of said portable computer to disengage.

* * * * *